United States Patent
Peng et al.

(10) Patent No.: US 11,661,652 B2
(45) Date of Patent: May 30, 2023

(54) WET CLEANING INSIDE OF GASLINE OF SEMICONDUCTOR PROCESS EQUIPMENT

(71) Applicant: Applied Materials, Inc., Santa Clara, CA (US)

(72) Inventors: Gang Peng, Fremont, CA (US); Halbert Chong, San Jose, CA (US); Marcus Pereira, Morgan Hill, CA (US); David W. Groechel, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 277 days.

(21) Appl. No.: 16/412,798

(22) Filed: May 15, 2019

(65) Prior Publication Data

US 2019/0352775 A1 Nov. 21, 2019

Related U.S. Application Data

(60) Provisional application No. 62/672,239, filed on May 16, 2018.

(51) Int. Cl.
 *C23C 16/44* (2006.01)
 *B08B 7/02* (2006.01)
 (Continued)

(52) U.S. Cl.
 CPC .......... *C23C 16/4407* (2013.01); *B08B 7/028* (2013.01); *H01J 37/32449* (2013.01);
 (Continued)

(58) Field of Classification Search
 CPC ........... H01L 21/67253; H01L 21/6704; H01L 21/67017; H01J 37/32862;
 (Continued)

(56) References Cited

U.S. PATENT DOCUMENTS 5,313,982 A * 5/1994 Ohmi ................ C23C 8/14
                                                137/246
5,467,791 A * 11/1995 Kato ................. B08B 3/12
                                                134/166 C (Continued)

FOREIGN PATENT DOCUMENTS

FR         2549746 A  *  2/1985  ............... B08B 3/12
JP      2002136939 A  *  5/2002  ........... B08B 9/0321
WO   WO-2019199963 A1 * 10/2019

OTHER PUBLICATIONS

Crest Ultrasonic ("Generators", WayBackMachine printout of ultrasonicsindia.com/generators.html as archived Jul. 7, 2011). (Year: 2011).*

(Continued)

*Primary Examiner* — Christopher Remavege

(74) *Attorney, Agent, or Firm* — Patterson + Sheridan, LLP

(57) ABSTRACT

Embodiments described herein relate to a gas line cleaning system and a method of cleaning gas lines. The gas line cleaning system includes a connector having a first end and a second end, and a fluid system. The fluid system includes a fluid source configured to flow a fluid through a fluid conduit connected to the first end, and an ultrasonic transducer coupled to the fluid conduit configured to apply an ultrasonic energy to the fluid conduit to agitate the fluid. The ultrasonic energy creates a mechanical energy that reverberates in the fluid conduit and propagates into the fluid to (Continued)

remove particles that may have formed on an inside surface of a gas line connected to the second end and carry away particles inside the gas line.

19 Claims, 2 Drawing Sheets

(51) Int. Cl.
*H01L 21/67* (2006.01)
*H01J 37/32* (2006.01)

(52) U.S. Cl.
CPC .. *H01J 37/32862* (2013.01); *H01L 21/67253* (2013.01); *H01J 2237/335* (2013.01); *H01J 2237/3321* (2013.01)

(58) Field of Classification Search
CPC ......... H01J 37/32449; H01J 2237/3321; H01J 2237/335; B08B 7/028; B08B 9/027; B08B 3/12; B08B 5/00; B08B 2209/027; B08B 7/00; B08B 13/00
See application file for complete search history.

(56) References Cited

U.S. PATENT DOCUMENTS

| | | | | |
|---|---|---|---|---|
| 6,418,960 B1* | 7/2002 | Mintz | ................... | B08B 9/0321 |
| | | | | 137/242 |
| 6,663,718 B1* | 12/2003 | Mush | ....................... | B08B 9/00 |
| | | | | 123/198 A |
| 7,789,319 B2* | 9/2010 | Marsh | ............... | C23C 16/45593 |
| | | | | 239/1 |
| 2003/0221701 A1* | 12/2003 | Hardwicke | ........... | F01D 25/002 |
| | | | | 134/1 |
| 2009/0293906 A1* | 12/2009 | Baddeley | ................. | B08B 3/12 |
| | | | | 134/1 |
| 2010/0326475 A1* | 12/2010 | Ku | ........................ | B08B 9/0328 |
| | | | | 134/22.12 |
| 2015/0298179 A1* | 10/2015 | Suematsu | .............. | B08B 9/032 |
| | | | | 134/100.1 |

OTHER PUBLICATIONS

FR 2549746 A, Machine Translation, Abstract. (Year: 2022).*
JP 2002136939, Machine Translation, Abstract (Year: 2022).*

* cited by examiner

WET CLEANING INSIDE OF GASLINE OF SEMICONDUCTOR PROCESS EQUIPMENT

CROSS-REFERENCE TO RELATED APPLICATIONS

This application claims benefit of U.S. Provisional Patent Application Ser. No. 62/672,239, filed May 16, 2018, which is herein incorporated by reference.

BACKGROUND

Field

Embodiments of the present disclosure generally relate to apparatuses and methods to clean chamber components. More particularly, embodiments of the present disclosure relate to apparatuses and methods to clean gas lines.

Description of the Related Art

Chemical vapor deposition (CVD), plasma enhanced chemical vapor deposition (PECVD), and atomic layer deposition (ALD) are generally employed to deposit thin films on a substrate, such as a transparent substrate for flat panel display or semiconductor wafer. CVD, PECVD, and ALD are generally accomplished by introducing precursor gases into a vacuum chamber that contains a substrate. The precursor gases are typically flowed from gas sources through a system of gas lines coupled to a gas diffuser situated near the top of the chamber. Generally, the gas lines of the system of gas lines are welded. During PECVD the precursor gases in the chamber are energized (e.g., excited) into a plasma by applying radio frequency (RF) power to the chamber from one or more RF sources coupled to the chamber. The excited gases react to form a layer of material on a surface of the substrate.

However, weldments of metal tubes, such as aluminum tubes or stainless steel tubes, to form gas lines typically generate particles inside the gas lines and form rough sections and/or surfaces inside the gas lines. Furthermore, the generated particles may attach to the rough sections and/or surfaces inside the gas lines. During, CVD, PECVD, and ALD the flow of precursor through the gas lines may cause the particles to flake off and be carried downstream to the chamber where the particles may deposit on the substrate and/or chamber surfaces.

The current industrial approach to clean the gas lines is to immerse the gas lines into a tank with ultrasonic transducer(s) at the bottom or the side wall of the tank. The ultrasonic energy from the transducers is applied to the outside surfaces of the gas line with very limited energy applied to the particles attached to the inside surfaces of the gas line. Thus, removal of particles attached to the inside surfaces of the gas lines is minimal.

Accordingly, there is a need for gas line cleaning systems and methods of cleaning gas lines.

SUMMARY

In one embodiment, a gas line cleaning system is provided. The gas line cleaning system has a fluid system that includes a fluid source, a fluid conduit connected to the fluid source to flow a fluid through the fluid conduit, a connector with a first end and a second end, the first end connected to the fluid conduit, and an ultrasonic transducer coupled to the fluid conduit to agitate a fluid in the fluid conduit using ultrasonic energy.

In another embodiment, a gas line cleaning system is provided. The gas line cleaning system includes a connector having a first end and a second end and a fluid system. The fluid system includes a fluid source configured to flow a fluid through a fluid conduit connected to the first end, and an ultrasonic transducer coupled to the fluid conduit configured to apply an ultrasonic energy to the fluid conduit to agitate the fluid. The ultrasonic energy creates a mechanical energy that reverberates in the fluid conduit and propagates into the fluid to remove particles that may have formed on an inside surface of a gas line connected to the second end and carry away particles inside the gas line.

In another embodiment, a method of cleaning a gas line is provided. The method includes connecting a fluid system to a gas line. The fluid system has a fluid conduit. The fluid is flowed through the fluid conduit and the gas line. An ultrasonic energy is applied to the fluid conduit to agitate the fluid, wherein the fluid removes particles that may have formed on an inside surface of the gas line and carries away particles inside the gas line. The fluid exiting the gas line is monitored through a sensor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a gas line cleaning system and a method of cleaning gas lines. The gas line cleaning system includes a connector having a first end and a second end, and a fluid system. The fluid system includes a fluid source configured to flow a fluid through a fluid conduit connected to the first end, and an ultrasonic transducer coupled to the fluid conduit configured to apply an ultrasonic energy to the fluid conduit to agitate the fluid. The ultrasonic energy creates a mechanical energy that reverberates in the fluid conduit and propagates into the fluid to remove particles that may have formed on an inside surface of a gas line connected to the second end and carry away particles inside the gas line.

Figure 1:
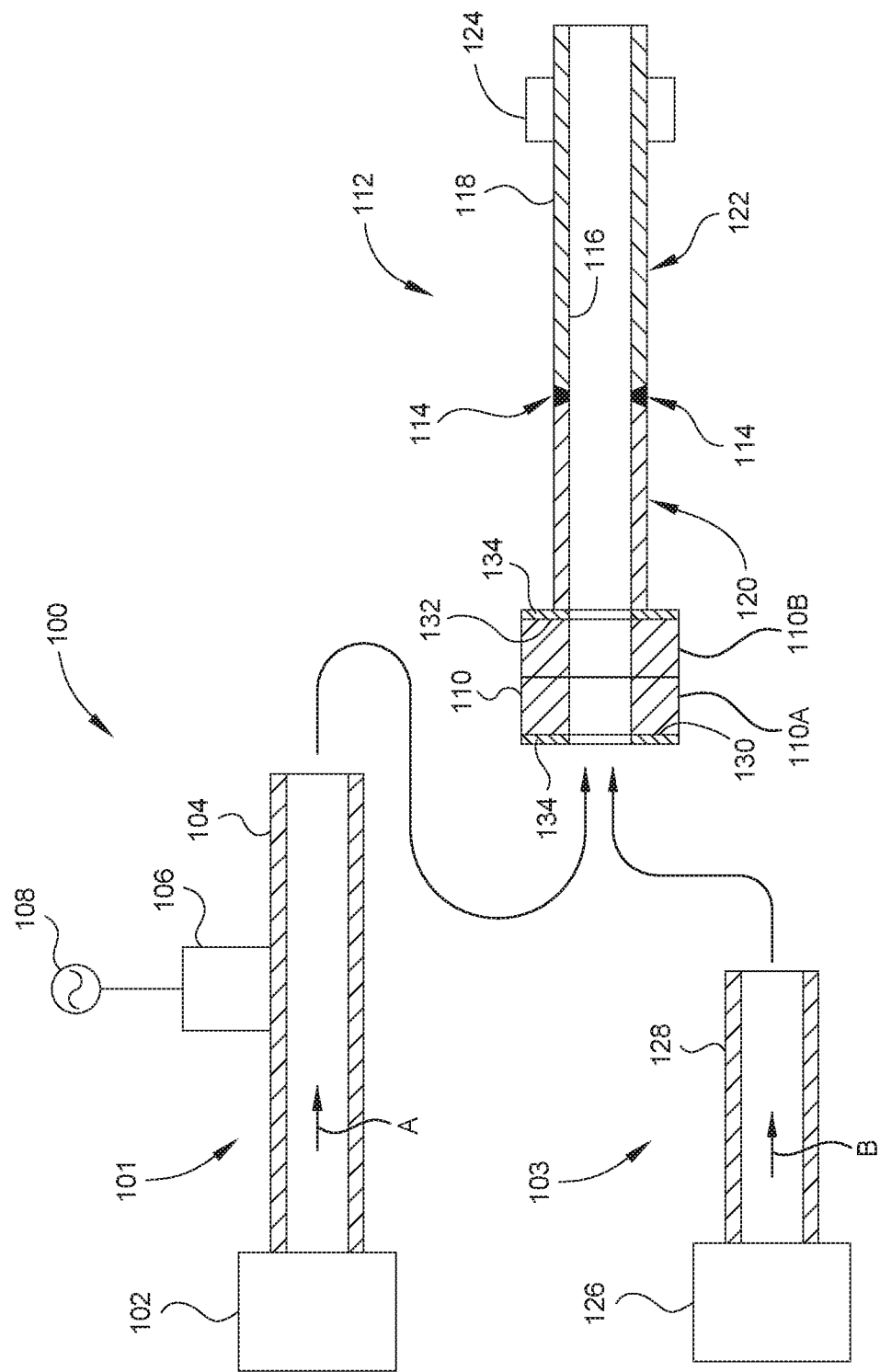
FIG. 1 is a schematic cross-sectional view of a gas line cleaning system according to an embodiment.

FIG. 1 is a schematic cross-sectional view of a gas line cleaning system 100 according to embodiments disclosed herein. It is to be understood that the gas line cleaning system described herein is an exemplary gas line cleaning system and other gas line cleaning systems, including gas line cleaning systems from other manufacturers, may be used with or modified to accomplish aspects of the present disclosure.

The gas line cleaning system 100 includes a fluid system 101, a drying gas system 103, and a connector 110. The fluid system 101 includes fluid source 102, a fluid conduit 104, an ultrasonic transducer 106, and an AC power source 108. The fluid source 102 is connected to the fluid conduit 104. The ultrasonic transducer 106 is in contact with the fluid conduit 104. In one embodiment, the ultrasonic transducer 106 is in contact with the inside of the fluid conduit 104. In another embodiment, the ultrasonic transducer 106 is in contact with the outside the fluid conduit 104. The ultrasonic transducer 106 is connected to the AC power source 108. In one embodiment, the ultrasonic transducer 106 is a piezoelectric transducer configured to expand or contract depending on the polarity of the voltage supplied by the AC power source 108. Frequently alternating the polarity of the voltage will result in ultrasonic energy that creates a mechanical energy that reverberates in the fluid conduit 104 and propagates into fluid. In one embodiment, the ultrasonic transducer 106 is configured to apply ultrasonic energy to the fluid conduit 104 at a frequency of about 100 kHz to 1.5 MHz. The drying gas system 103 includes gas source 126 and a gas source line 128. The gas source 126 is connected to the gas source line 128.

The connector 110 is configured to connect to the fluid conduit 104 and the gas source line 128. The connector 110 allows the fluid system 101 and the drying gas system 103 to connect to the gas lines, such as a gas line 112. In one embodiment, the connector 110 is stainless steel. Gaskets 134 are at a first end 130 and a second end 132 of the connector 110 to not introduce contamination or particles into the fluid conduit 104, the gas source line 128, and the gas line 112. In one embodiment, the gaskets 134 are a silver coated metal combined with a fluoropolymer elastomer (e.g., Viton® elastomer). The fluid conduit 104 and gas source line 128 connect to the connector 110 at a first end 130. The gas line 112 connects to the connector 110 at a second end 132. In some embodiments, the connector 110 may be a union that connects between a fitting that is coupled the fluid conduit 104 or the gas source line 128 and a connector that is coupled to the gas line 112. In one example, the connector 110 includes multiple portions, such as, a first portion 110A having the first end 130 to be connected to the fluid conduit 104 or the gas source line 128 and a second portion 110B having the second end 132 to be connected to the gas line 112. In another example, the connector 110 includes a first portion 110A that is to be connected to a connector, or a portion of a connector, coupled to the fluid conduit 104 or the gas source line 128 and a second portion 110B that is to be connected to a connector, or a portion of a connector, coupled to the gas line 112. In some configurations, for example, the connector may include at least a portion of a VCR or a VCO fitting from Swagelock, KF fitting, ISO fitting, a ConFlat fitting, and/or other vacuum compatible fitting. The gas line 112 includes weldments 114 bonding a first metal tube 120 and a second metal tube 122 to form the gas line 112. The gas line 112 includes an inside surface 116 and an outside surface 118. In one embodiment, the first metal tube 120 and second metal tube 122 comprise aluminum.

The fluid source 102 is configured to flow a fluid "A" (FIG. 1) through the fluid conduit 104, connector 110, and gas line 112. In one embodiment, the fluid source 102 is configured to flow the fluid A at a flow rate of about 0.5 L/min to about 20 L/min, a pressure of about 10 psi to about 80 psi, and a temperature of about 20° C. to about 80° C. In another embodiment, the fluid A includes deionized water (DIW), an acidic solution, a basic solution, and/or an organic solvent. The ultrasonic transducer 106 connected to the AC power source 108 is configured to apply ultrasonic energy to the fluid conduit 104. In one embodiment, ultrasonic energy is applied to the fluid conduit 104 at a frequency of about 100 kHz to 1.5 MHz. The fluid A flowing through the fluid conduit 104 is agitated such that the fluid A removes particles that may have formed on the inside surface 116 of the gas line 112 and carries away particles inside the gas line 112. The ultrasonic energy creates a mechanical energy. The mechanical energy reverberates in the fluid conduit 104 and propagates into the fluid with high efficiency to agitate the fluid A. The agitated fluid A flowing through the gas line 112 applies the mechanical energy the inside surface 116 of the gas line 112 that detaches particles formed on the inside surface 116. The spread of energy through the fluid A depends on the viscosity of the fluid A. For example, a fluid A with a high viscosity requires a higher frequency of ultrasonic energy to agitate the fluid A with enough mechanical energy to detach particles formed on the inside surface 116. A sensor 124, such as a liquid particle monitor, is connected to the gas line 112 to measure particle size and particle count.

The gas source 126 is configured to flow a gas "B" (FIG. 1) through the gas source line 128, connector 110, and gas line 112. In one embodiment, the gas source 126 is configured to flow the gas B at a flow rate of about 0.1 L/min to about 3 L/min, a pressure of about 7 psi to about 100 psi, and a temperature of about 20° C. to about 250° C. In another embodiment, the gas B includes nitrogen gas ($N_2$), clean dry air (CDA), argon (Ar), hydrogen gas ($H_2$), and/or helium (He). The gas B is configured to remove residual fluid A inside the gas line 112 and dry the inside surface of 116 of the gas line 112.

Figure 2:
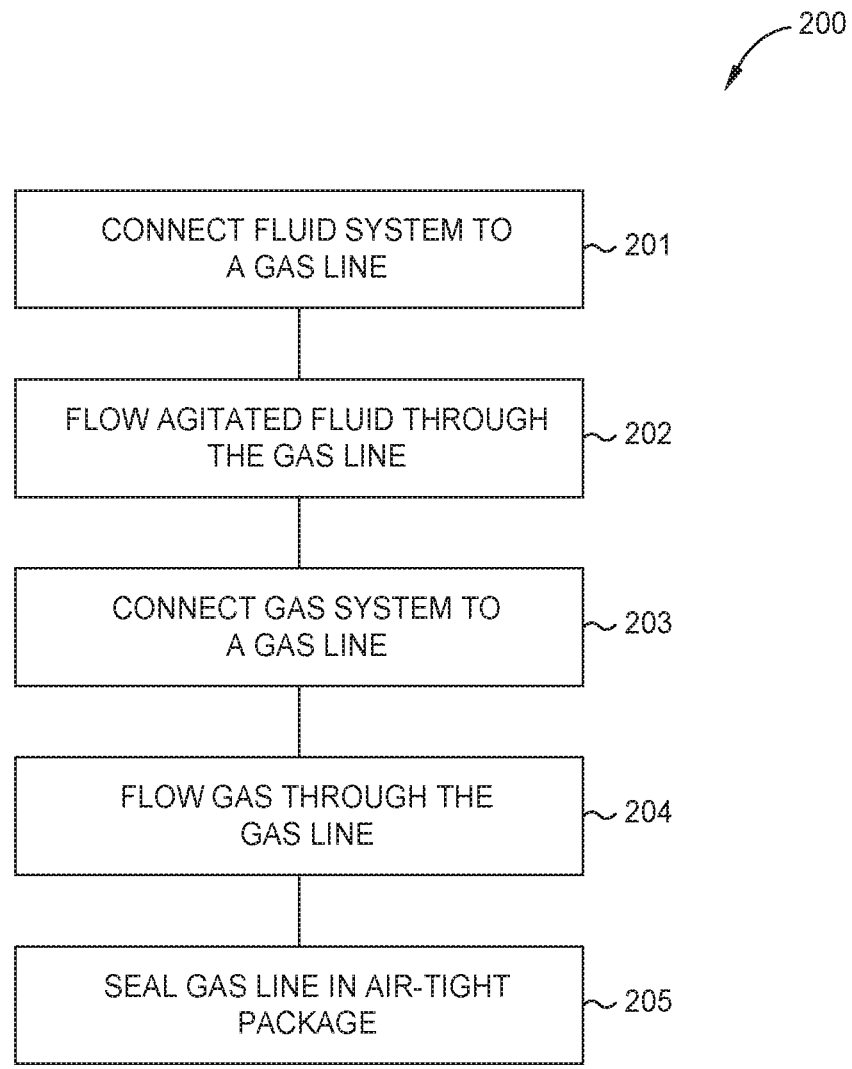
FIG. 2 is a flow diagram illustrating operations of a method of cleaning a gas line according to an embodiment.

FIG. 2 is a flow diagram illustrating operations of a method 200 of cleaning the gas line 112. At operation 201, the fluid system 101 of the gas line cleaning system 100 is connected to the gas line 112. The fluid conduit 104 connects to the connector 110 at the first end 130 and the gas line 112 connects to the connector 110 at the second end 132. At operation 202, the fluid system 101 flows agitated fluid A through the gas line 112. The fluid source 102 flows the fluid A through the fluid conduit 104 at a flow rate of about 0.5 L/min to about 20 L/min, a pressure of about 10 psi to about 80 psi, and a temperature of about 20° C. to about 80° C. In another embodiment, the fluid A includes deionized water (DIW), an acidic solution, a basic solution, and/or an organic solvent. The ultrasonic transducer 106, contacting fluid conduit 104, applies ultrasonic energy to the fluid conduit 104 at a frequency of about 100 kHz to 1.5 MHz to agitate the fluid A such that the fluid A removes particles that may have formed on the inside surface 116 of the gas line 112 and carries away particles inside the gas line 112. The fluid A flowing through the fluid conduit 104 is agitated such that the fluid A removes particles that may have formed on the inside surface 116 of the gas line 112 and carries away particles inside the gas line 112. The ultrasonic energy creates a mechanical energy. The mechanical energy reverberates in the fluid conduit 104 and propagates into the fluid A with high efficiency to agitate the fluid. The agitated fluid A flowing through the gas line 112 applies the mechanical energy the inside surface 116 of the gas line 112 that detaches particles formed on the inside surface 116.

During operation 202, the fluid A exiting the gas line 112 is monitored. The fluid A flows through the sensor 124 connected to the gas line 112 to measure particle size and particle count. Measurements of particle size and particle count are monitored for a preventive maintenance and/or a troubleshooting practice based on contamination levels. When the particle count is less than threshold values for predetermined particle sizes, the gas line 112 is clean. In one embodiment, the fluid system 101 flows agitated fluid A through the gas line 112 for a predetermined period of time. In another embodiment, the fluid system 101 flows agitated fluid A through the gas line 112 until the particle count is less than threshold values for predetermined particle sizes. A threshold value corresponds to removal of about 95% of a predetermined particle size. For example, if 54,200 particles/cm$^2$ (p/cm$^2$) of a 0.1 μm predetermined particle size are inside the gas line 112 prior to the method 200, the threshold value is about 2,710 p/cm$^2$. If 22,600 particles of a 0.2 μm predetermined particle size are inside the gas line 112 prior to the method 200, the threshold value is about 1,130 p/cm$^2$. Table 1 illustrates the flow of agitated DIW through the gas line 112 for a predetermined period of time of 28 minutes at a flow rate of about 1 L/min to about 6 L/min, a pressure of about 10 psi to about 20 psi, and a temperature of about 25° C., and a frequency of 0.1 to 1.5 MHz.

| Process Time, min | 0.1 μm, p/cm2 | Particle Removal, % | 0.2 μm, p/cm2 | Particle Removal, % |
|---|---|---|---|---|
| 0 | 52,418 | 0 | 22,609 | 0 |
| 1 | 55,056 | −5 | 17,896 | 21 |
| 3 | 43,852 | 16 | 144,483 | 36 |
| 13 | 6,165 | 88 | 1,840 | 92 |
| 28 | 2,496 | 95 | 516 | 98 |

At operation 203, the drying gas system 103 of the gas line cleaning system 100 is connected to the gas line 112. The gas source line 128 connects to the connector 110 at the first end 130 and the gas line 112 remains connected to the connector 110 at the second end 132. At operation 204, the drying gas system 103 flows gas B through the gas line 112. The gas source 126 flows the gas B through the gas source line 128 at a flow rate of about 1 L/min to about 10 L/min, a pressure of about 10 psi to about 20 psi, and a temperature of about 20° C. to about 45° C. In one embodiment, the gas B includes nitrogen gas (N$_2$), clean dry air (CDA), argon (Ar), hydrogen gas (H$_2$), and/or helium (He). The flow of the gas B removes residual fluid A inside the gas line 112 and dries the inside surface of 116 of the gas line 112. At optional operation 205, the gas line 112 is sealed in an air-tight package. The air-tight package may be a polymer bag or container.

In summation, a gas line cleaning system and a method of cleaning gas lines are described herein. The fluid system of the gas line cleaning system includes an ultrasonic transducer coupled to the fluid conduit applies ultrasonic energy to the fluid conduit to agitate the fluid such that the fluid removes particles that may have formed on the inside surface of a gas line and carries away particles inside the gas line. The gas system of the gas line cleaning system includes a gas source that flows gas through the gas line to remove residual fluid inside the gas line and dry the inside surface of the gas line While the foregoing is directed to examples of the present disclosure, other and further examples of the disclosure may be devised without departing from the basic scope thereof, and the scope thereof is determined by the claims that follow.

The invention claimed is:

1. A gas line cleaning system, comprising:
a fluid system that comprises:
   a fluid source;
   a fluid conduit connected to the fluid source, wherein the fluid source is configured to cause a fluid to flow through an opening formed in the fluid conduit; and
   an ultrasonic transducer coupled to the fluid conduit to agitate a fluid disposed in the fluid conduit using an ultrasonic energy when the fluid provided from the fluid source flows through the opening in the fluid conduit;
a drying gas system that comprises:
   a gas source; and
   a gas source conduit connected to the gas source; and
a connector with a first gasket at a first end and a second gasket at a second end, wherein the connector is operable to:
   receive the fluid conduit of the fluid system in a fluid cleaning state, the fluid conduit directly connected to the first end by the first gasket, and wherein the second end is configured to be connected to a gas line by the second gasket so that the opening in the fluid conduit is fluidly coupled to an inner surface of the gas line; and
   receive the gas source conduit of the drying gas system in a gas drying state, the gas source conduit directly connected to the first end by the first gasket, and wherein the second end of the connector is configured to be disconnected from the gas line.

2. The system of claim 1, wherein the gas source includes a gas of at least one of nitrogen gas (N$_2$), clean dry air (CDA), argon (Ar), hydrogen gas (H$_2$), and helium (He).

3. The system of claim 1, wherein the fluid system is configured to flow the fluid through the fluid conduit to be connected to the first end of the connector and the gas line to be connected to the second end of the connector.

4. The system of claim 3, wherein the ultrasonic transducer coupled to the fluid conduit is configured to apply the ultrasonic energy to the fluid conduit to agitate the fluid, and wherein the ultrasonic energy creates a mechanical energy that reverberates in the fluid conduit and propagates into the fluid to remove particles that may have formed on an inside surface of the gas line and carry away particles inside the gas line.

5. The system of claim 1, wherein the fluid source is operable to flow the fluid at a flow rate of about 0.5 L/min to about 20 L/min and at a pressure of about 10 psi to about 80 psi.

6. The system of claim 1, wherein the fluid comprises at least one of deionized water (DIW), an acidic solution, a basic solution, and an organic solvent.

7. The system of claim 1, wherein the ultrasonic transducer is connected to an AC power source and is operable to apply ultrasonic energy to the fluid conduit with a frequency of about 100 kHz to about 1.5 MHz.

8. The system of claim 1, wherein the ultrasonic energy creates a mechanical energy that reverberates in the fluid conduit and propagates into the fluid.

9. A gas line cleaning system comprising:
a connector with a first gasket at a first end and a second gasket at a second end;
a fluid system that comprises:
   a fluid source configured to flow a fluid through a fluid conduit to be connected to the first end, the connector operable to receive the fluid conduit of the fluid system in a fluid cleaning state, the fluid conduit directly connected to the first end by the first gasket, and wherein the second end is configured to be connected to a gas line by the second gasket; and
   an ultrasonic transducer coupled to the fluid conduit configured to apply an ultrasonic energy to the fluid conduit to agitate the fluid, wherein the ultrasonic energy creates a mechanical energy that reverberates in the fluid conduit and propagates into the fluid to remove particles that may have formed on an inside surface of the gas line to be connected to the second end and carry away particles inside the gas line; and
a drying gas system that comprises:
   a gas source; and
   a gas source conduit connected to the gas source, the connector operable to receive the gas source conduit of the drying gas system in a gas drying state, the gas source conduit directly connected to the first end by the first gasket, and wherein the gas line is operable to be disconnected from the second end of the connector.

10. A method of cleaning a gas line, comprising:
connecting a fluid system to a gas line in a fluid cleaning state, the fluid system in the fluid cleaning state having a fluid conduit directly connected to a first end of a connector, wherein a second end of the connector is directly connected to the gas line;
flowing a fluid through the fluid conduit, the connector, and the gas line;
applying an ultrasonic energy to the fluid conduit to agitate the fluid, wherein the fluid removes particles that may have formed on an inside surface of the gas line and carries away particles inside the gas line;
monitoring the fluid exiting the gas line using a sensor, wherein the sensor is configured to measure a number particles in the fluid exiting the gas line; and
disconnecting the fluid conduit and in a gas drying state connecting a gas source conduit of a gas drying system to the gas line, the gas source conduit directly connected to the first end of the connector.

11. The method of claim 10, further comprising:
flowing a gas through the gas line to remove residual fluid inside the gas line and dry the inside surface of the gas line.

12. The method of claim 11, further comprising sealing the gas line in an air-tight package.

13. The method of claim 11, wherein the fluid comprises at least one of deionized water (DIW), an acidic solution, a basic solution, and an organic solvent, and the gas comprises at least one of nitrogen gas ($N_2$), clean dry air (CDA), argon (Ar), hydrogen gas ($H_2$), and helium (He).

14. The method of claim 13, wherein the fluid is flowed a flow rate of about 0.5 L/min to about 20 L/min, a pressure of about 10 psi to about 80 psi, and the ultrasonic energy is applied to the fluid conduit at frequency of 100 kHz to 1.5 MHz.

15. The method of claim 10, wherein the ultrasonic energy is applied for a predetermined period of time or until a particle count is less than a threshold value for a predetermined particle size.

16. The method of claim 15, wherein the threshold value corresponds to removal of about 95% of a predetermined particle size.

17. The method of claim 15, wherein the fluid is flowed at a flow rate of about 5 L/min, a pressure of about 15 psi, and a temperature of about 23° C., and the ultrasonic energy is applied to the fluid conduit at frequency of 1 MHz for a predetermined period of time of about 28 minutes.

18. The method of claim 10, wherein the ultrasonic energy creates a mechanical energy that reverberates in the fluid conduit and propagates into the fluid.

19. The method of claim 10, wherein monitoring the fluid exiting the gas line through the sensor comprises measuring a particle count and a particle size.

\* \* \* \* \*